(12) United States Patent
Miyazaki

(10) Patent No.: US 10,754,465 B2
(45) Date of Patent: Aug. 25, 2020

(54) DISPLAY DEVICE

(71) Applicant: Sharp Kabushiki Kaisha, Sakai, Osaka (JP)

(72) Inventor: Shinichi Miyazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/485,829

(22) PCT Filed: Feb. 9, 2018

(86) PCT No.: PCT/JP2018/004670
§ 371 (c)(1),
(2) Date: Aug. 14, 2019

(87) PCT Pub. No.: WO2018/151048
PCT Pub. Date: Aug. 23, 2018

(65) Prior Publication Data
US 2020/0050309 A1    Feb. 13, 2020

(30) Foreign Application Priority Data

Feb. 15, 2017  (JP) ................. 2017-025548

(51) Int. Cl.
*G06F 3/041*  (2006.01)
*G06F 3/0346*  (2013.01)
*G06F 3/047*  (2006.01)

(52) U.S. Cl.
CPC .......... *G06F 3/0412* (2013.01); *G06F 3/0346* (2013.01); *G06F 3/047* (2013.01)

(58) Field of Classification Search
CPC . G06F 2203/04101; G06F 2203/04108; G06F 3/0346
See application file for complete search history.

(56) References Cited

U.S. PATENT DOCUMENTS

| | | | |
|---|---|---|---|
| 2011/0096024 A1* | 4/2011 | Kwak | G06F 3/044 345/174 |
| 2011/0193818 A1* | 8/2011 | Chen | G06F 3/0421 345/174 |

(Continued)

FOREIGN PATENT DOCUMENTS

| | | |
|---|---|---|
| JP | 2015-014932 A | 1/2015 |
| JP | 2015-138603 A | 7/2015 |

*Primary Examiner* — Dong Hui Liang
(74) *Attorney, Agent, or Firm* — Keating & Bennett, LLP

(57) ABSTRACT

A display device includes, on a display substrate having a display region, a proximity sensor arranged outside the display region, and a terminal section connected to the proximity sensor. The proximity sensor includes a plurality of conductors arranged so as to surround the periphery of the display region while being spaced apart from each other. The plurality of conductors are configured such that one ends thereof are connected to the terminal section, a predetermined voltage is applied thereto via the terminal section, and a capacitance is formed with an object to be detected. The proximity sensor includes capacitance adding regions that are provided in the vicinity of a gap portion at which the plurality of conductors are spaced apart from each other and that are adapted to compensate for the capacitance formed with the object to be detected in the gap portion.

4 Claims, 3 Drawing Sheets

(56) References Cited

U.S. PATENT DOCUMENTS

| | | | | |
|---|---|---|---|---|
| 2011/0314425 A1* | 12/2011 | Chiang | .................. | G06F 3/041 |
| | | | | 715/863 |
| 2014/0359539 A1* | 12/2014 | Locker | ................. | G06F 3/0488 |
| | | | | 715/863 |
| 2018/0095587 A1* | 4/2018 | Kurasawa | ............. | G06F 3/0416 |
| 2020/0081574 A1* | 3/2020 | Noguchi | ................ | G06F 3/044 |

* cited by examiner

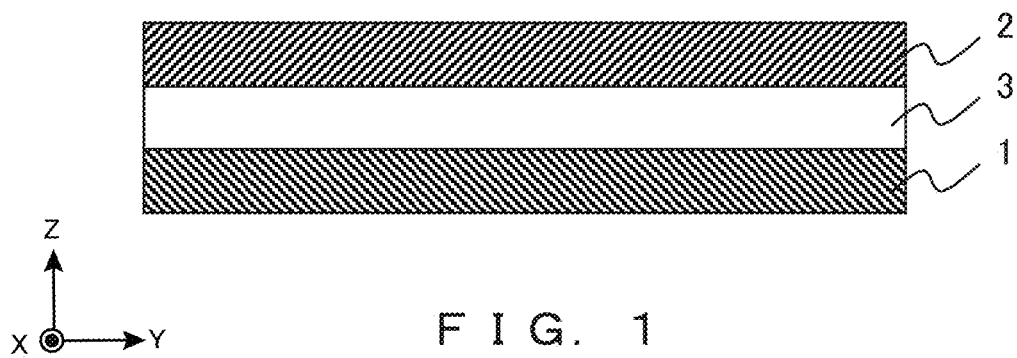
F I G. 1
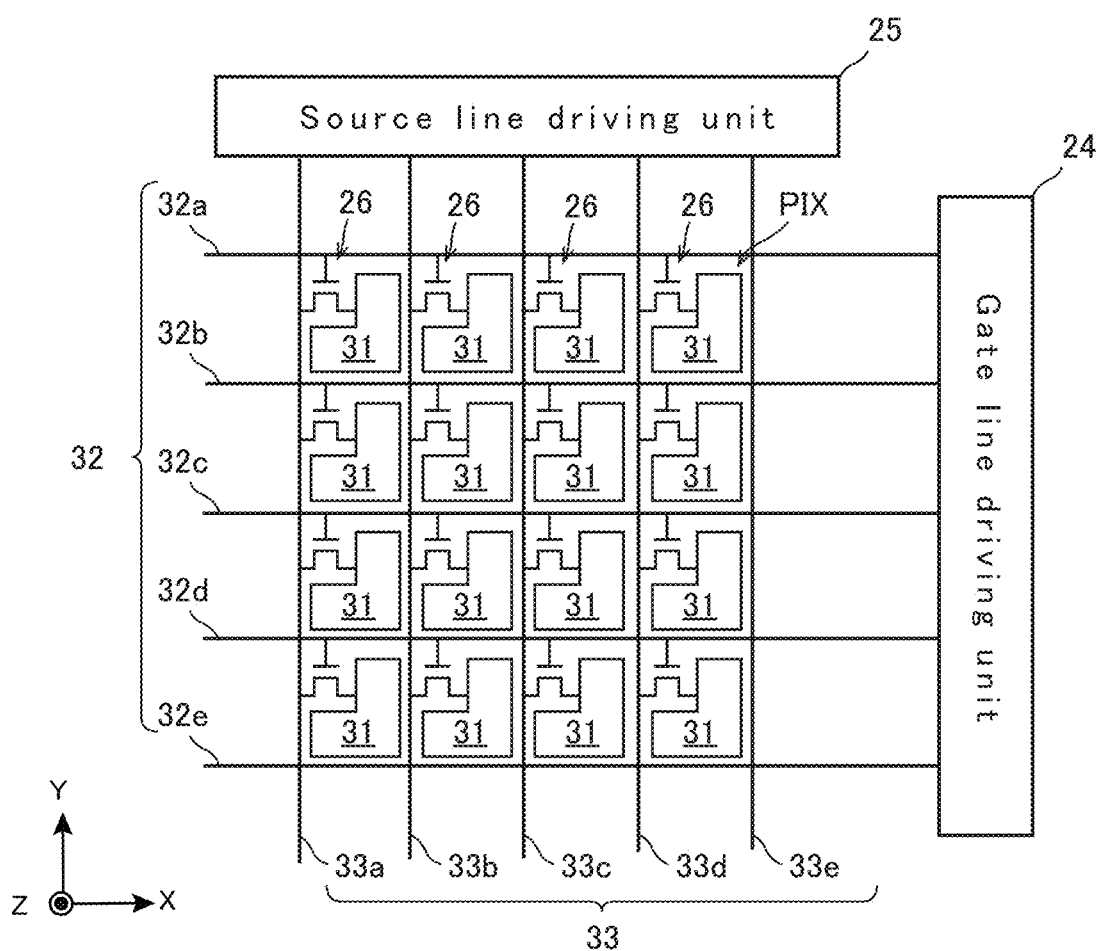
F I G. 2

DISPLAY DEVICE

TECHNICAL FIELD

The present invention relates to a display device.

BACKGROUND ART

In recent years, portable terminals, such as smartphones, provided with a proximity sensor has been in widespread use. The proximity sensor provided in a portable terminal is used for various purposes. For example, in order to prevent malfunctions of a touch panel of a smartphone due to the approach of a user's face, ear, or the like to the smartphone when the user makes a phone call, the proximity sensor detects the approach of an object to be detected, and the touch panel is controlled on the basis of the detection result (see JP 2015-014932 A).

DISCLOSURE OF INVENTION

Various types of sensors such as infrared sensors that utilize infrared light, capacitive sensors, and inductive sensors are used as a proximity sensor. When a capacitive sensor is used as a proximity sensor, a conductor is arranged so as to surround the periphery of a display region in a portable terminal, for example. As the size of a display panel increases, it becomes difficult to constitute the proximity sensor with one conductor owing to the limitation regarding the resistance and parasitic capacitance of the proximity sensor. On this account, as shown in FIG. 5, a plurality of conductors 100 are arranged around a display region r while being spaced apart from each other. When the plurality of conductors are arranged while being spaced apart from each other as described above, the area where capacitive coupling is formed with an object to be detected in the vicinity of a region D between the conductor 100 and the conductor 100 (hereinafter, this region is referred to as "gap portion D") is smaller than those in regions other than the gap portion D. Accordingly, the detection sensitivity in the vicinity of the gap portion D is lower than those in the regions other than the gap portion D. As a result, variations in detection sensitivity occur in the proximity sensor, and whether the object to be detected has approached cannot be detected correctly.

It is an object of the present invention to provide a display device that can correctly detect the approach of an object to be detected.

A display device according to one embodiment of the present invention is a display device including: a display substrate having a display region; a proximity sensor that includes a plurality of conductors arranged outside the display region on the display substrate so as to surround a periphery of the display region while being spaced apart from each other, the proximity sensor being configured such that a predetermined voltage is applied thereto and a capacitance is formed between the proximity sensor and an object to be detected; and a terminal section for supplying the predetermined voltage to the proximity sensor, wherein the terminal section is connected to one end of each of the plurality of conductors, and the proximity sensor has a capacitance adding region that is provided in the vicinity of a gap portion at which the plurality of conductors are spaced apart from each other and that is adapted to compensate for the capacitance formed with the object to be detected in the gap portion.

According to the present invention, the approach of an object to be detected can be detected correctly.

BRIEF DESCRIPTION OF DRAWINGS

FIG. 1 is a sectional view showing a schematic configuration of a display device in a first embodiment.

FIG. 2 is a plan view showing a schematic configuration of an active matrix substrate shown in FIG. 1.

DESCRIPTION OF EMBODIMENTS

Figure 3:
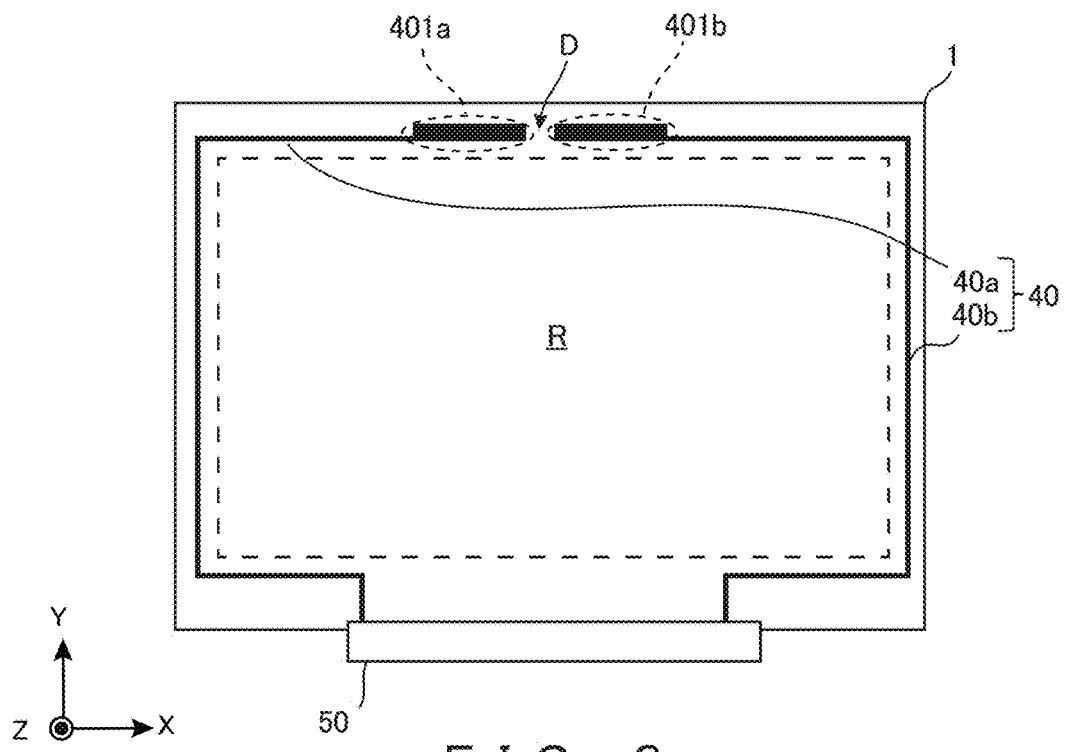
FIG. 3 is a plan view showing an example of the arrangement of a proximity sensor provided on the active matrix substrate shown in FIG. 1.

A display device according to one embodiment of the present invention is a display device including: a display substrate having a display region; a proximity sensor that includes a plurality of conductors arranged outside the display region on the display substrate so as to surround a periphery of the display region while being spaced apart from each other, the proximity sensor being configured such that a predetermined voltage is applied thereto and a capacitance is formed between the proximity sensor and an object to be detected; and a terminal section for supplying the predetermined voltage to the proximity sensor, wherein the terminal section is connected to one end of each of the plurality of conductors, and the proximity sensor has a capacitance adding region that is provided in the vicinity of a gap portion at which the plurality of conductors are spaced apart from each other and that is adapted to compensate for the capacitance formed with the object to be detected in the gap portion (first configuration).

According to the first configuration, the display device is provided with the proximity sensor that includes the plurality of conductors arranged outside the display region on the display substrate while being spaced apart from each other. One end of each of the plurality of conductors is connected to the terminal section for supplying the predetermined voltage. The proximity sensor has a capacitance adding region for compensating for the capacitance formed with the object to be detected in the gap portion. With this configuration, the detection sensitivity for the object to be detected in the gap portion is improved as compared with the case where the capacitance adding region is not provided, and accordingly, the approach of the object to be detected can be detected correctly.

In the first configuration, the capacitance adding region may include wide portions that are provided in the respective conductors so as to extend in predetermined ranges from the gap portion and have greater widths than portions other than the predetermined ranges (second configuration).

According to the second configuration, the area where capacitive coupling is formed with the object to be detected in the vicinity of the gap portion increases as compared with the case where the widths of the conductors are uniform. As a result, the detection sensitivity for the object to be detected in the gap portion is improved, whereby the difference in detection sensitivity between the gap portion and regions other than the gap portion can be reduced. Accordingly, it is possible to reduce variations in detection sensitivity as the proximity sensor.

In the first configuration, the capacitance adding region may include auxiliary conductors that are arranged outside the display region on the display substrate and in the vicinity of the gap portion and have the same electric potential as the plurality of conductors (third configuration).

According to the third configuration, the area where capacitive coupling is formed with the object to be detected in the vicinity of the gap portion increases as compared with the case where the auxiliary conductors are not provided. As a result, the detection sensitivity for the object to be detected in the gap portion is improved, whereby the difference in detection sensitivity between the gap portion and the regions other than the gap portion can be reduced. Accordingly, it is possible to reduce variations in detection sensitivity as the proximity sensor.

In the third configuration, the display device may further include a wiring group that is arranged on the display substrate and includes display wiring used for image display on the display region, and the auxiliary conductors may be constituted using, out of wirings included in the wiring group, parts of at least one of the wirings other than the display wiring (fourth configuration).

According to the fourth configuration, the auxiliary conductors can be constituted using the wiring(s) other than the display wiring wire without providing conductors dedicated to the proximity sensor separately.

Embodiments of the present invention will be described below with reference to the drawings. Components/portions that are identical or equivalent to each other in the drawings are given the same reference numerals, and descriptions thereof are not repeated. For clarity of illustration, in the drawings to be referred to in the following description, structures may be shown in simplified or schematic forms, and some components may be omitted. The dimensional ratios between components shown in the respective drawings do not necessarily represent actual dimensional ratios.

FIG. 1 is a sectional view of a display device 10 in the present embodiment. The display device 10 in the present embodiment includes an active matrix substrate 1, a counter substrate 2, and a liquid crystal layer 3 interposed between the active matrix substrate 1 and the counter substrate 2. The counter substrate 2 is provided with color filters (not shown). Although not shown in FIG. 1, the display device 10 includes a backlight provided on a surface of the active matrix substrate 1 on the side opposite to the liquid crystal layer 3 side.

The display device 10 has a function of displaying an image, and also has a function of detecting a position touched by a user on the displayed image (touched position). This display device 10 is a display device equipped with a so-called in-cell type touch panel, in which elements necessary for detecting the touched position are provided on the active matrix substrate 1.

FIG. 2 is a plan view showing a schematic configuration of the active matrix substrate 1 shown in FIG. 1. As shown in FIG. 2, on the active matrix substrate 1, a plurality of gate lines 32 and a plurality of source lines 33 that cross the plurality of gate lines 32 are provided. Pixels PIX, which are constituted by the gate lines 32 and the sources lines 32, are each provided with a switching element 26 connected to the gate line 33 and to the source line 33 and a pixel electrode 31 connected to the switching element 26. The switching element 26 is a thin film transistor (TFT), for example.

On the counter substrate 2 (see FIG. 1), color filters of three colors, namely, red (R), green (G), and blue (B), are provided so as to correspond to the respective pixel electrodes 31. With this configuration, each of the pixel electrodes 31 functions as a subpixel of any one color out of R, G, and B.

The plurality of gate lines 32 are connected to a gate line driving unit 24 provided outside a display region of the active matrix substrate 1. The gate line driving unit 24 applies gate line driving signals for switching the plurality of gate lines 32a, 32b, 32c, . . . to the selected state sequentially one by one for every single horizontal scanning period.

The plurality of source lines 33 are connected to a source line driving unit 25 provided outside the display region of the active matrix substrate 1. In an image display period, the source line driving unit 25 supplies data signals corresponding to the gradations of an image to be displayed to the source lines 33.

In the display device 10, liquid crystal molecules contained in the liquid crystal layer 3 are driven in an in-plane switching mode. In order to achieve the in-plane switching mode, the pixel electrodes and counter electrodes (also called "common electrodes"), which are both involved in electric field formation, are formed on the active matrix substrate 1.

Although not shown in FIG. 2, the counter electrodes are formed on a surface of the active matrix substrate 1 on the liquid crystal layer 3 side. Each counter electrode is in a rectangular shape that is approximately square with each side thereof being about 4 mm, for example, and the plurality of counter electrodes are arranged in matrix. The counter electrodes each have a slit (e.g., several micrometers in width) for generating in-plane electric field between the counter electrodes and the pixel electrodes.

On the active matrix substrate 1, a controller (not shown) connected to the counter electrodes is provided outside the display region. The controller performs image display control for displaying an image, and also performs touched position detection control for detecting a touched position.

Furthermore, on the active matrix substrate 1, a proximity sensor 40 constituted by conductors 40a and 40b is provided outside the display region R, as shown in FIG. 3. The conductors 40a and 40b are arranged so as to surround the periphery of the display region R while being spaced apart from each other.

On the active matrix substrate 1, a terminal 50 is provided on an upper edge opposite to an edge provided with the gap portion D, which is a space between the conductors 40a and 40b, and the conductors 40a and 40b are each connected to the terminal 50. To the terminal 50, a control circuit (not shown) for driving the conductors 40a and 40b is to be connected. The conductors 40a and 40b are configured such that a predetermined voltage is applied thereto from the control circuit via the terminal 50 and capacitances are formed between the conductors 40a and 40b and an object to be detected. The control circuit detects whether the object to be detected has approached within a predetermined distance on the basis of the change in capacitance in the conductors 40a and 40b.

In FIG. 3, the conductor 40a has a wide portion 401a, which is a wider portion that extends in a predetermined range in the x-axis direction from the gap portion D. The wide portion 401a is wider than the other portion in the conductor 40a. The dimension of the wide portion 401a can be determined as appropriate according to a predetermined dimension of an object to be detected and the size of the display device 10. In this example, the width of the wide portion 401a is about twice the width of the portion other than the wide portion 401a in the conductor 40a, and the length of the predetermined range in which the wide portion 401a is provided is approximately from 7 cm to 11 cm.

Similarly to the conductor 40a, the conductor 40b also has a wide portion 401b, which is a wider portion that extends in a predetermined range in the x-axis direction from the gap portion D, and the dimension of the wide portion 401b is the same as that of the wide portion 401a.

By providing the wide portions 401a and 401b in the vicinity of the gap portion D as described above, the area where capacitive coupling is formed with an object to be detected in the vicinity of the gap portion D increases as compared with the case where the wide portions 401a and 401b are not provided, whereby the capacitance formed with the object to be detected in the vicinity of the gap portion D can be increased. Accordingly, it is possible to improve the detection sensitivity for the object to be detected in the vicinity of the gap portion D.

The display device 10 in the present embodiment performs display of an image and driving of the counter electrodes (not shown) as touch sensors in a time-sharing manner under the control of the controller (not shown). That is, during the operations as the touch panel, each of the counter electrodes is driven as an independent sensor, and during the operations as the display, the counter electrodes and the pixel electrodes to be described below operate in pairs to perform the image display control. Also, the display device 10 applies a predetermined voltage to the conductors 40a and 40b and detects whether an object to be detected has approached under the control of the control circuit (not shown) connected to the conductors 40a and 40b during a period in which touch detection is not performed.

In the first embodiment described above, the conductors 40a and 40b include, as capacitance adding regions for compensating for the capacitance in the gap portion D, the wide portions 401a and 401b, respectively, in the predetermined ranges from the gap portion D. By providing the wide portions 401a and 401b, the area where capacitive coupling is formed with an object to be detected in the gap portion D increases, whereby the detection sensitivity in the gap portion D can be improved. As a result, in the conductors 40a and 40b, the difference in detection sensitivity between the gap portion D and the regions other than the gap portion D is reduced, and accordingly, the approach of the object to be detected can be detected correctly.

Second Embodiment

The present embodiment describes an example where the detection sensitivity in the gap portion D is improved using a configuration that is different from the configuration used in the first embodiment.

Figure 4:
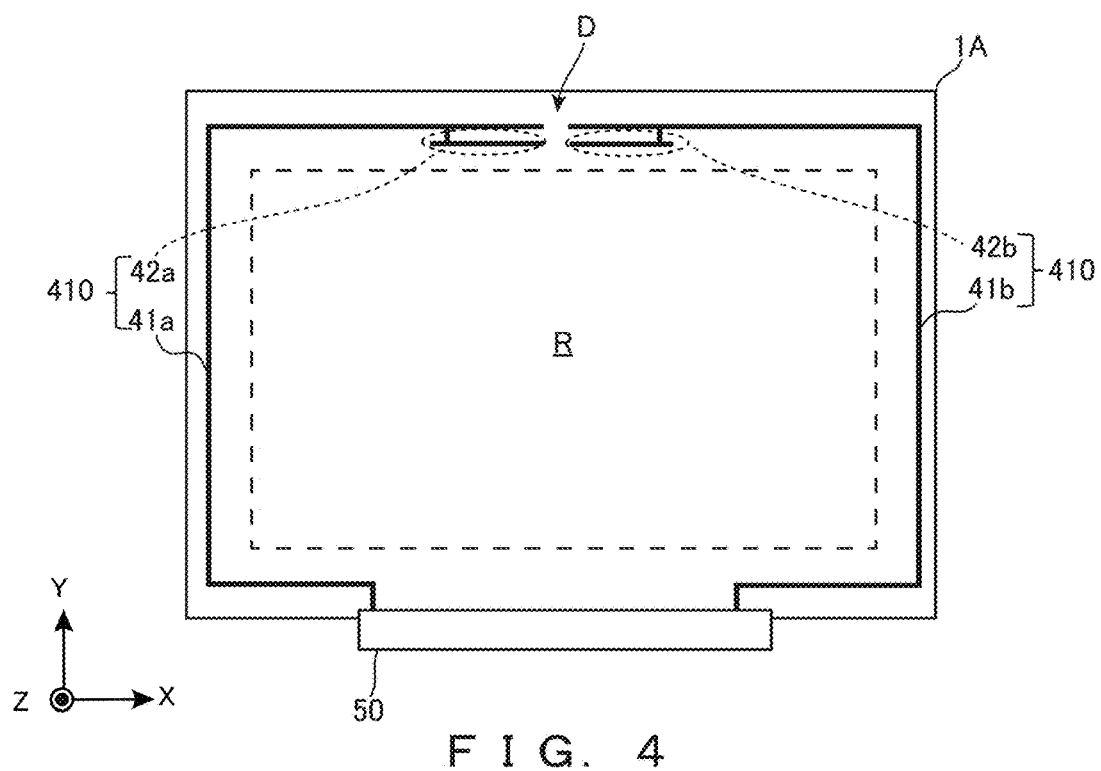
FIG. 4 is a plan view showing an example of the arrangement of a proximity sensor provided on an active matrix substrate in a second embodiment.
Figure 5:
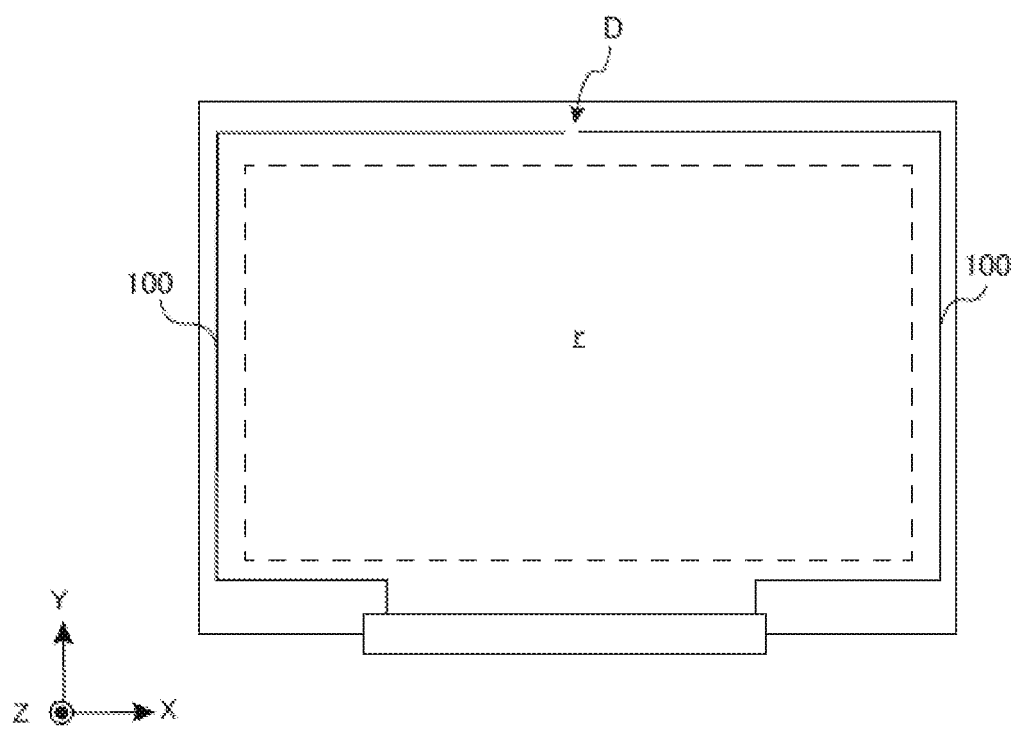
FIG. 5 is a plan view showing an example of the arrangement of a conventional proximity sensor.

FIG. 4 is a plan view showing an example of the configuration of a proximity sensor 410 provided on an active matrix substrate 1A in the present embodiment. In FIG. 4, the same components as those in the first embodiment are given the same reference numerals. In the following, the configuration different from that of the first embodiment will be described mainly.

As shown in FIG. 4, the proximity sensor 410 is constituted by conductors 41a and 41b and auxiliary conductors 42a and 42b connected to the conductors 41a and 41b, respectively.

Similarly to the above-described conductors 40a and 40b, one end of each of the conductors 41a and 41b is connected to a terminal 50, and the conductors 41a and 41b are arranged so as to surround the periphery of a display region R while being spaced apart from each other. The widths of the conductors 41a and 41b are substantially uniform.

The auxiliary conductors 42a and 42b are arranged such that they are spaced apart from each other at a gap portion D and extend substantially parallel to parts of the conductors 41a and 41b, respectively.

By providing the auxiliary conductors 42a and 42b connected to the conductors 41a and 41b in the vicinity of the gap portion D as described above, the area where capacitive coupling is formed with an object to be detected in the vicinity of the gap portion D increases as compared with the case where the auxiliary conductors 42a and 42b are not provided. As a result, the detection sensitivity for the object to be detected in the vicinity of the gap portion D is improved, whereby variations in detection sensitivity between the gap portion D and positions other than the gap portion D can be reduced.

The auxiliary conductors 42a and 42b may be provided for the proximity sensor 410, or may be parts of wiring that is provided in advance for another purpose and arranged in parallel with the conductors 41a and 41b. Examples of such wiring include an inspection wiring group provided in advance for inspection during the production of the active matrix substrate 1A, a spare wiring group provided in advance for correcting defects in the active matrix substrate 1A, and grounded ground wiring for protecting elements arranged in the display region R (these wirings are all not shown). When any of these wirings is used as the auxiliary conductors 42a and 42b, the wiring is cut into pieces with predetermined lengths in advance.

The auxiliary conductors 41a and 41b may be constituted using one of these wirings, or may be constituted using a plurality of different wirings adjacent to each other in combination. For example, when the ground wiring, the spare wiring group, and the inspection wiring group are arranged in parallel in this order from the side closer to the conductors 41a and 41b, the ground wiring and the spare wiring group may be used in combination to provide the auxiliary conductors, or the ground wiring, the spare wiring group, and the inspection wiring group may be used in combination to provide the auxiliary conductors.

The distance between the auxiliary conductor 42a and the conductor 41a, the distance between the auxiliary conductor 42a and the conductor 41b, and the sizes (width and length) of each of the auxiliary conductors 42a and 42b may be determined freely according to, for example, a predetermined size of an object to be detected, capacitances formed with other elements in the display device 10, and the like.

In the second embodiment described above, the auxiliary conductors 42a and 42b arranged in the vicinity of the gap portion D function as capacitance adding regions for compensating for the capacitance in the gap portion. With this configuration, the capacitance to be formed with an object to be detected in the gap portion D can be increased as compared with the case where the auxiliary conductors 42a and 42b are not provided, whereby variations in detection sensitivity as the proximity sensor 410 can be reduced.

Although the display device according to the present invention has been described above by way of illustrative embodiments, the configuration of the display device according to the present invention is not limited to those described in the above-described embodiments and may be modified in various ways.

(1) Although the above-described first embodiment is directed to an example where the widths of the wide portions 401a and 401b shown in FIG. 3 are substantially uniform, the widths of the wide portions 401a and 401b need not be uniform. The wide portions need only be provided as regions where the widths of the conductors 40a and 40b are broadened in the vicinity of the gap portion D so as to compensate for the capacitance formed with an object to be detected in the gap portion D.

The invention claimed is:

1. A display device comprising:
    a display substrate having a display region;
    a proximity sensor that comprises a plurality of conductors arranged outside the display region on the display substrate so as to surround a periphery of the display region while being spaced apart from each other, the proximity sensor being configured such that a predetermined voltage is applied thereto and a capacitance is formed between the proximity sensor and an object to be detected; and
    a terminal section for supplying the predetermined voltage to the proximity sensor,
    wherein the terminal section is connected to one end of each of the plurality of conductors, and
    the proximity sensor has a capacitance adding region that is provided in the vicinity of a gap portion at which the plurality of conductors are spaced apart from each other and that is adapted to compensate for the capacitance formed with the object to be detected in the gap portion.

2. The display device according to claim 1,
    wherein the capacitance adding region comprises auxiliary conductors that are arranged outside the display region on the display substrate and in the vicinity of the gap portion and have the same electric potential as the plurality of conductors.

3. The display device according to claim 2, further comprising a wiring group that is arranged on the display substrate and comprises display wiring used for image display on the display region,
    wherein the auxiliary conductors are constituted using, out of wirings included in the wiring group, parts of at least one of the wirings other than the display wiring.

4. The display device according to claim 1,
    wherein the capacitance adding region comprises wide portions that are provided in the respective conductors so as to extend in predetermined ranges from the gap portion and have greater widths than portions other than the predetermined ranges.

* * * * *